United States Patent
Ma et al.

(10) Patent No.: US 12,009,164 B2
(45) Date of Patent: Jun. 11, 2024

(54) PULSE VOLTAGE CONDITIONING METHOD OF VACUUM INTERRUPTER WITH AUTOMATIC CONDITIONING ENERGY ADJUSTMENT

(71) Applicant: XI'AN JIAOTONG UNIVERSITY, Shaanxi (CN)

(72) Inventors: Hui Ma, Shaanxi (CN); Jingyu Shen, Shaanxi (CN); Yingsan Geng, Shaanxi (CN); Zhiyuan Liu, Shaanxi (CN); Jianhua Wang, Shaanxi (CN); Jing Yan, Shaanxi (CN); Yu Du, Shaanxi (CN)

(73) Assignee: XI'AN JIAOTONG UNIVERSITY, Shaanxi (CN)

( * ) Notice: Subject to any disclaimer, the term of this patent is extended or adjusted under 35 U.S.C. 154(b) by 132 days.

(21) Appl. No.: 17/880,299

(22) Filed: Aug. 3, 2022

(65) Prior Publication Data
US 2022/0375704 A1    Nov. 24, 2022

(30) Foreign Application Priority Data

Aug. 24, 2021   (CN) .......................... 202110972202.2

(51) Int. Cl.
*H01H 33/00*    (2006.01)
*H01H 33/59*    (2006.01)
*H03K 5/24*     (2006.01)

(52) U.S. Cl.
CPC .............. *H01H 33/59* (2013.01); *H03K 5/24* (2013.01)

(58) Field of Classification Search
CPC ...... H01H 33/664; H01H 33/66; H01H 33/59; H01H 33/02; G01R 31/3272
See application file for complete search history.

(56) References Cited

U.S. PATENT DOCUMENTS

| | | | |
|---|---|---|---|
| 7,253,630 B1 * | 8/2007 | Zhou .................. | G01R 31/3274 324/424 |
| 10,825,625 B1 * | 11/2020 | Marshall ............ | H01H 33/6662 |
| 2017/0263399 A1 * | 9/2017 | Heinz ................. | H01H 33/167 |
| 2019/0013662 A1 * | 1/2019 | Norrga ................ | H02H 3/021 |
| 2023/0009635 A1 * | 1/2023 | Lakirovich .......... | H02H 1/0007 |

* cited by examiner

*Primary Examiner* — Tuan T Lam

(57) ABSTRACT

A pulse voltage conditioning method of a vacuum interrupter with automatic conditioning energy adjustment based on a trend of a breakdown voltage of the vacuum interrupter during a conditioning process. A current-limiting resistor and a parallel capacitor are automatically adjusted to ensure the conditioning energy reaching a critical value without deconditioning effect. The critical value refers to a maximum conditioning energy without damaging the electrode surfaces, namely an optimal conditioning energy, which can better remove insulation defects on the electrode surface and improve insulation performance of a vacuum gap. The problems of insufficient conditioning and deconditioning effect during conventional voltage conditioning process of the vacuum interrupter can be solved. Therefore, insulation strength of the vacuum interrupter can be raised to a higher level through conditioning.

5 Claims, 2 Drawing Sheets

PULSE VOLTAGE CONDITIONING METHOD OF VACUUM INTERRUPTER WITH AUTOMATIC CONDITIONING ENERGY ADJUSTMENT

CROSS REFERENCE OF RELATED APPLICATION

The present invention claims priority under 35 U.S.C. 119(a-d) to CN 202110972202.2, filed Aug. 24, 2021.

BACKGROUND OF THE PRESENT INVENTION

Field of Invention

The present invention relates to technical field of vacuum interrupter conditioning, and more particularly to a pulse voltage conditioning method of a vacuum interrupter with automatic conditioning energy adjustment.

Description of Related Arts

With the rapid development of vacuum circuit breakers for the entire power system, the vacuum interrupter, as the core component of the vacuum circuit breaker, is expected to have higher and higher insulation performance. In order to improve the insulation performance of the vacuum interrupter, conditioning is necessary for the vacuum interrupter to remove the residual gas, impurities and machining burrs on the electrode surfaces. The electrode surface should be "passivated", so that the gap inside the vacuum interrupter can reach optimal insulation performance.

The main conditioning methods of vacuum interrupters include voltage conditioning and current conditioning. The voltage conditioning method applies a certain high voltage at both terminals of the vacuum interrupter, and the electric field is concentrated at the micro-protrusions on the cathode surface in the vacuum gap. Due to the high electric field, a high-energy electron beam is field-emitted. The electron beam impacts on the anode surface, causing the local temperature on the anode surface to increase sharply for gasification. At the same time, the field emission also causes the local gasification on the cathode surface. With the foregoing processes, the micro-protrusions, micro-particles and adsorbed gases on the electrode surfaces are removed, thereby improving the insulation performance of the vacuum interrupter. For voltage conditioning, the effect of pulse voltage conditioning is significantly better than those of power frequency voltage conditioning and glow discharge conditioning.

Conventionally, conditioning energy is not controlled for the vacuum interrupter during the pulse voltage conditioning process. Therefore, if the conditioning energy is too small, the insulation defects on the electrode surface cannot be completely removed, resulting in insufficient conditioning and unoptimized insulation performance; if the conditioning energy is too large, large craters may be formed on the electrode surface and metal particles may be sputtered, resulting in more insulation defects. As a result, the "deconditioning" effect will occur and the insulation performance of the vacuum interrupters will be reduced.

SUMMARY OF THE PRESENT INVENTION

In order to solve problems of the prior art, an object of the present invention is to provide a pulse voltage conditioning method of a vacuum interrupter with automatic conditioning energy adjustment, which adjusts the conditioning energy based on a trend of a breakdown voltage of the vacuum interrupter during a conditioning process. A current-limiting resistor and a parallel capacitor are automatically adjusted to ensure the conditioning energy reaching a critical value without deconditioning effect. The critical value refers to a maximum conditioning energy without damaging the electrode surfaces, namely an optimal conditioning energy, which can better remove insulation defects on the electrode surface and improve insulation performance of a vacuum gap. The problems of insufficient conditioning and deconditioning effect during conventional voltage conditioning process of the vacuum interrupter can be solved. Therefore, insulation strength of the vacuum interrupter can be raised to a higher level through conditioning.

Accordingly, in order to accomplish the above objects, the present invention provides:

a pulse voltage conditioning method of a vacuum interrupter with automatic conditioning energy adjustment, comprising steps of: decreasing an applied voltage if breakdown occurs and increasing the applied voltage if the breakdown does not occur, so as to adjust a conditioning energy based on a trend of a breakdown voltage of the vacuum interrupter during a conditioning process; automatically adjusting a current-limiting resistor and a parallel capacitor to optimize the conditioning energy, thereby removing insulation defects on electrode surfaces and improving insulation performance of a vacuum gap;

wherein the pulse voltage conditioning method comprises specific steps of:

step 1: according to a voltage level of the vacuum interrupter, determining a peak value of an initial applied pulse voltage $U_{c(0)}$, which is $P_1$ times of a breakdown voltage $U_L$ under a standard lightning impulse of the vacuum interrupter at the voltage level, wherein $P_1$ ranges from 20%-50%;

$$U_{c(0)} = P_1 \cdot U_L \qquad (1)$$

step 2: according to the conditioning initial pulse voltage, adjusting an initial conditioning energy to $Q_{c(0)}$, wherein $Q_{c(0)}$ ranges from 1-10 J; if an output energy of a pulse voltage source is larger than $Q_{c(0)}$, then connecting the current-limiting resistor in series at an output end of the pulse voltage source to decrease the conditioning energy; if the output energy is less than $Q_{c(0)}$, connecting the parallel capacitor to both ends of the vacuum interrupter to increase the conditioning energy;

step 3: successively applying a pulse voltage to the vacuum interrupter, measuring a breakdown voltage of the vacuum interrupter with a voltage divider, and measuring a breakdown current $I_{b(n)}$ flowing through the vacuum interrupter with a current transformer; wherein if a current peak value flowing through the vacuum interrupter exceeds a critical value of a breakdown current $I_{bc}$, the vacuum interrupter is judged to break down, otherwise the vacuum interrupter withstands the pulse voltage; $I_{bc}$ ranges from 10-20 mA;

$$I_{b(n)} \geq I_{bc} \qquad (2)$$

if the vacuum interrupter breaks down, decreasing an applied pulse voltage in a next conditioning process by $\Delta U$:

$$U_{c(n+1)} = U_{c(n)} - \Delta U \qquad (3)$$

wherein a voltage step $\Delta U$ is $P_2$ times of the breakdown voltage $U_L$ under the standard lightning impulse voltage of the vacuum interrupter at the voltage level, and $P_2$ ranges from 1%-4%;

$$\Delta U = P_2 \cdot U_L \quad (4)$$

if the vacuum interrupter withstands the pulse voltage, increasing the applied pulse voltage in the next conditioning process by $\Delta U$:

$$U_{c(n+1)} = U_{c(n)} + \Delta U \quad (5)$$

step 4: counting a trend of the breakdown voltage and a maximum breakdown voltage $U_{bmax}$ during the conditioning process, and calculating the conditioning energy $Q_{c(n)}$ according to waveforms of a measured breakdown voltage $U_{b(n)}$ and the breakdown current $I_{b(n)}$:

$$Q_{c(n)} = \int (U_{b(n)} \cdot I_{b(n)}) dt \quad (6)$$

wherein if the breakdown voltage decreases to $P_3$ times of the maximum breakdown voltage $U_{bmax}$, a deconditioning effect is judged to occur, and $P_3$ ranges from 70%-90%;

$$U_c \leq P_3 \cdot U_{cmax} \quad (7)$$

then increasing the current-limiting resistor or decreasing the parallel capacitor to decrease the next conditioning energy $Q_{c(n+1)}$ to $P_4$ times of $Q_{c(n)}$, wherein $P_4$ ranges from 80%-90%; meanwhile, counting the trend of breakdown voltage and the maximum breakdown voltage $U_{bmax}$ again;

$$Q_{c(n+1)} = P_4 \cdot Q_{c(n)} \quad (8)$$

step 5: if the deconditioning effect never occurs since beginning of the conditioning process, judging the conditioning energy to be low, and decreasing the current-limiting resistor or increasing the parallel capacitor to increase the next conditioning energy $Q_{c(n+1)}$ to $P_5$ times of $Q_{c(n)}$, wherein $P_5$ ranges from 105%-120%; if the deconditioning effect occurs one time, stopping increasing the conditioning energy. Then, the conditioning energy is gradually adjusted to a critical value where the deconditioning effect does not occur; wherein the critical value is a maximum conditioning energy without damaging the electrode surfaces, which is an optimal conditioning energy;

$$Q_{c(n+1)} = P_5 \cdot Q_{c(n)} \quad (9)$$

step 6: if the maximum breakdown voltage $U_{bmax}$ of the vacuum interrupter does not increase in continuous $N_s$ conditioning experiments, in which the deconditioning effect does not occur, regarding insulation performance of the vacuum interrupter as optimal and ending the conditioning process, wherein $N_s$ ranges from 300-500.

Preferably, the automatic conditioning energy adjustment is realized by programming; the measured breakdown voltage and the breakdown current are input, and a control signal for adjusting the current-limiting resistor and the parallel capacitor is output.

Preferably, a waveform of the applied pulse voltage is a standard lightning impulse voltage.

Preferably, the current-limiting resistor is a slide rheostat, which smoothly adjusts a resistance value by controlling a position of a slip sheet; or the current-limiting resistor is a multi-level resistance module, which changes the resistance value by controlling switches of different resistances.

Preferably, the parallel capacitor is a multi-level capacitance module, which changes a capacitance value by controlling switches of different capacitances.

Compared with the prior art, the present invention has the following advantages:

The present invention provides the pulse voltage conditioning method of the vacuum interrupter with the automatic conditioning energy adjustment. The trend of the breakdown voltage of the vacuum interrupter in the conditioning process is used to judge whether the conditioning energy is too large or too small, thereby automatically adjusting the current-limiting resistor and the parallel capacitor to ensure that the conditioning energy reach the critical value in which deconditioning effect does not occur, which means the optimal conditioning energy. As a result, the present invention can better remove insulation defects on the electrode surface and improve insulation performance of a vacuum gap. The problems of insufficient conditioning and deconditioning effect during conventional voltage conditioning process of the vacuum interrupter can be solved. Therefore, insulation performance of the vacuum interrupter can be raised to a higher level through conditioning.

DETAILED DESCRIPTION OF THE PREFERRED EMBODIMENT

Figure 1:
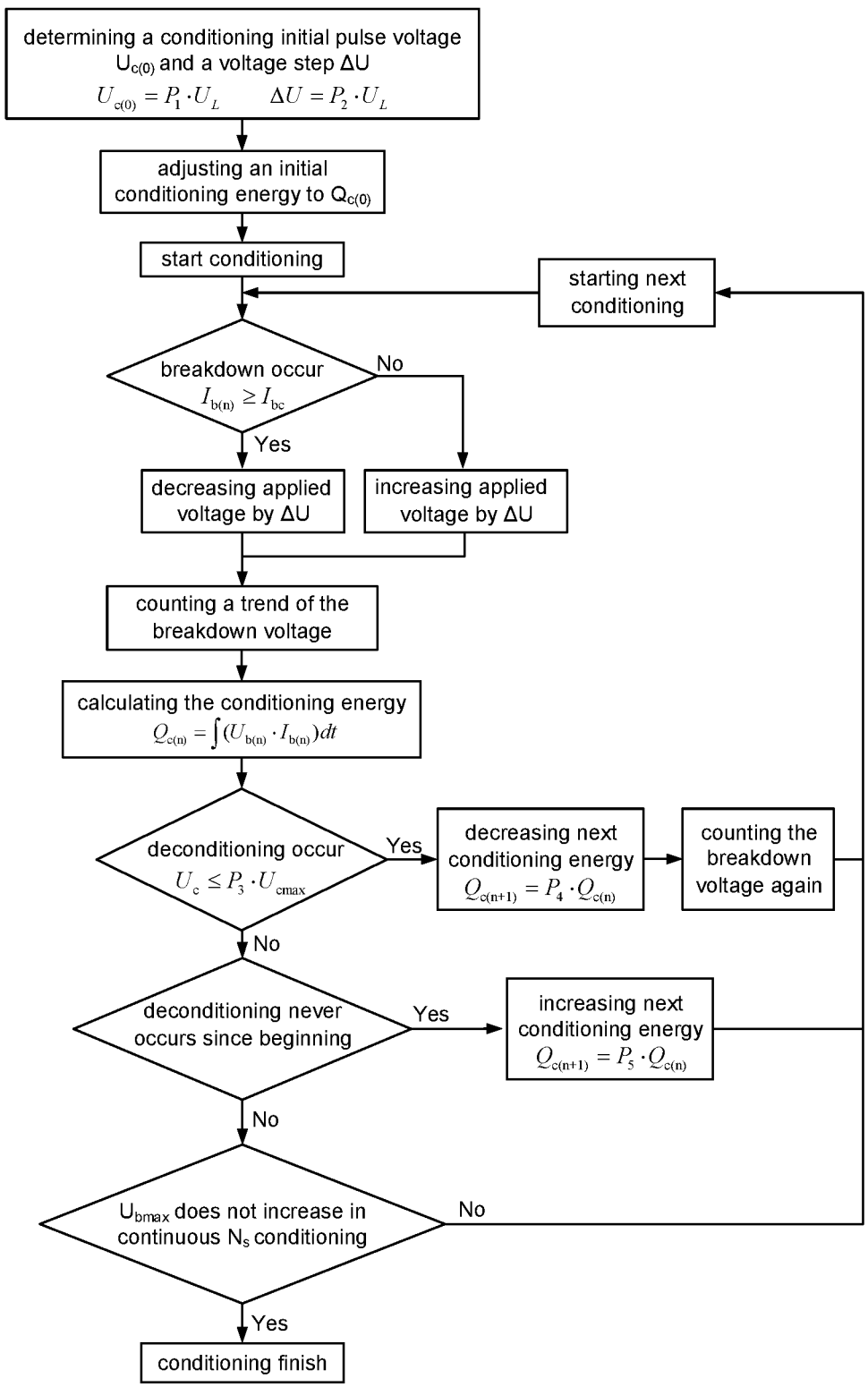
FIG. 1 is a flow chart of a pulse voltage conditioning method of a vacuum interrupter with automatic conditioning energy adjustment according to the present invention.

Referring to the drawings and embodiment, the present invention will be further illustrated.

Referring to FIG. 1, the present invention provides a pulse voltage conditioning method of a vacuum interrupter with automatic conditioning energy adjustment, comprising steps of: according to a voltage level of the vacuum interrupter, determining a peak value of conditioning initial pulse voltage $U_{c(0)}$ and a voltage step $\Delta U$; wherein the peak value of conditioning initial pulse voltage $U_{c(0)}$ is $P_1$ times of a breakdown voltage $U_L$ under standard lightning impulse voltage of the vacuum interrupter at the voltage level, and $P_1$ ranges from 20%-50%; the voltage step $\Delta U$ is $P_2$ times of the breakdown voltage $U_L$ of the vacuum interrupter at the voltage level, and $P_2$ ranges from 1%-4%;

$$U_{c(0)} = P_1 \cdot U_L \quad (1)$$

$$\Delta U = P_2 \cdot U_L \quad (2)$$

according to a conditioning initial pulse voltage, adjusting an initial conditioning energy to $Q_{c(0)}$, wherein $Q_{c(0)}$ ranges from 1-10 J; if a output energy of a pulse voltage source is larger than $Q_{c(0)}$, then connecting the current-limiting resistor in series to an output end of the pulse voltage source to decrease the conditioning energy; if the power output is less than $Q_{c(0)}$, connecting the parallel capacitor to both ends of the vacuum interrupter to increase the conditioning energy; after the above preparation, successively applying a pulse voltage to a vacuum interrupter, measuring a breakdown voltage of the vacuum interrupter with a voltage divider, and measuring a breakdown current $I_{b(n)}$ flowing through the vacuum interrupter with a current transformer; wherein if a peak value of current flowing through the vacuum interrupter exceeds a critical value of breakdown current $I_{bc}$, the vacuum interrupter is judged to break down, otherwise the vacuum interrupter withstands the pulse voltage; $I_{bc}$ ranges from 10-20 mA;

$$I_{b(n)} \geq I_{bc} \quad (3)$$

if the vacuum interrupter breaks down, decreasing the applied pulse voltage in a next conditioning process by $\Delta U$;

if the vacuum interrupter withstands the pulse voltage, increasing the applied pulse voltage in the next conditioning process by $\Delta U$; under both situations, storing a measured breakdown voltage and counting a trend of the breakdown voltage and a maximum breakdown voltage $U_{bmax}$ during the conditioning process, and calculating the conditioning energy $Q_{c(n)}$ according to waveforms of a measured breakdown voltage $U_{b(n)}$ and the breakdown current $I_{b(n)}$:

$$Q_{c(n)} = \int (U_{b(n)} \cdot I_{b(n)}) dt \quad (4)$$

wherein if the breakdown voltage drops to $P_3$ times of the maximum breakdown voltage $U_{bmax}$, a deconditioning effect is judged to occur, and $P_3$ ranges from 70%-90%; then increasing the current-limiting resistor or decreasing the parallel capacitor to decrease a next conditioning energy $Q_{c(n+1)}$ to $P_4$ times of $Q_{c(n)}$, wherein $P_4$ ranges from 80%-90%; meanwhile, counting the trend of breakdown voltage and the maximum breakdown voltage $U_{bmax}$ again;

$$U_c \leq P_3 \cdot U_{cmax} \quad (5)$$

$$Q_{c(n)} = P_4 \cdot Q_{c(n)} \quad (6)$$

step 5: if the deconditioning effect never occurs since beginning of the conditioning process, defining the conditioning energy as being low, and decreasing the current-limiting resistor or increasing the parallel capacitor to increase the next conditioning energy $Q_{c(n+1)}$ to $P_5$ times of $Q_{c(n)}$, wherein $P_5$ ranges from 105%-120%; if the deconditioning effect occurs, stopping increasing the conditioning energy;

$$Q_{c(n+1)} P_5 \cdot Q_{c(n)} \quad (7) \text{ and}$$

if the maximum breakdown voltage $U_{bmax}$ of the vacuum interrupter does not increase in continuous $N_s$ conditioning experiments during which the deconditioning effect does not occur, regarding insulation performance of the vacuum interrupter as optimal and ending the conditioning process, wherein $N_s$ ranges from 300-500.

Figure 2:
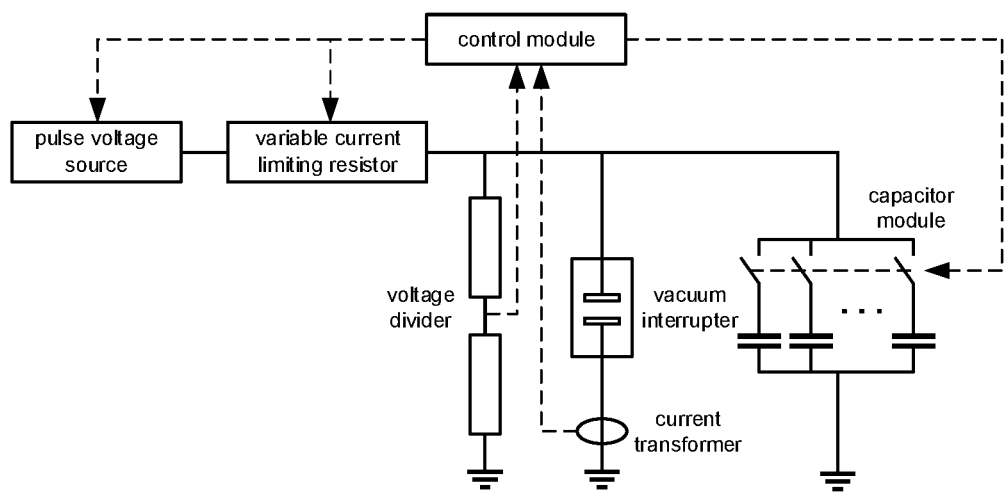
FIG. 2 is a schematic diagram of an experimental circuit of the pulse voltage conditioning method of the vacuum interrupter with the automatic conditioning energy adjustment according to the present invention.

FIG. 2 is a schematic diagram of an experimental circuit of the pulse voltage conditioning method of the vacuum interrupter with the automatic conditioning energy adjustment according to the present invention. Referring to FIG. 2, the pulse voltage source is connected to one end of the vacuum interrupter through the variable current-limiting resistor, and the other end of the vacuum interrupter is grounded. A current transformer measuring the breakdown current is arranged at the ground end of the vacuum interrupter. The vacuum interrupter is connected in parallel with both the voltage divider for measuring the breakdown voltage and the capacitor module for adjusting the conditioning energy. Data measured by the voltage divider and the current transformer is input to a control module through a signal wire. Then the control module calculates the applied voltage and the conditioning energy for the next conditioning process according to the measured breakdown voltage and the breakdown current. The control module also outputs control signals to the pulse voltage source, the variable current-limiting resistor and the parallel capacitor module to adjust the applied voltage and the conditioning energy, respectively.

The present invention is not limited to the above-mentioned embodiment, and those skilled in the art can make modifications and changes to the present invention according to the teachings of the present invention. All such modifications and changes should fall within the protection scope of the present invention.

What is claimed is:

1. A pulse voltage conditioning method of a vacuum interrupter with automatic conditioning energy adjustment, comprising steps of: decreasing a voltage if breakdown occurs and increasing the voltage if the breakdown does not occur, so as to adjust a conditioning energy based on a trend of a breakdown voltage of the vacuum interrupter during a conditioning process; automatically adjusting a current-limiting resistor and a parallel capacitor to optimize the conditioning energy, thereby removing insulation defects on electrode surfaces and improving insulation performance of a vacuum gap;

wherein the pulse voltage conditioning method comprises specific steps of:

step 1: according to a voltage level of the vacuum interrupter, determining a peak value of a conditioning initial pulse voltage $U_{c(0)}$, which is $P_1$ times of a breakdown voltage $U_L$ under a standard lightning impulse voltage of the vacuum interrupter at the voltage level, wherein $P_1$ ranges from 20%-50%;

$$U_{c(0)} = P_1 \cdot U_L \quad (1)$$

step 2: according to the conditioning initial pulse voltage, adjusting an initial conditioning energy to $Q_{c(0)}$, wherein $Q_{c(0)}$ ranges from 1-10 J; if an output energy of a pulse voltage source is larger than $Q_{c(0)}$, then connecting the current-limiting resistor in series to an output end of the pulse voltage source to decrease the conditioning energy; if the output energy is less than $Q_{c(0)}$, connecting the parallel capacitor to both ends of the vacuum interrupter to increase the conditioning energy;

step 3: successively applying a pulse voltage to the vacuum interrupter, measuring a breakdown voltage of the vacuum interrupter with a voltage divider, and measuring a breakdown current $I_{b(n)}$ flowing through the vacuum interrupter with a current transformer; wherein if a peak value of a current flowing through the vacuum interrupter exceeds a critical value of a breakdown current $I_{bc}$, the vacuum interrupter is judged to break down, otherwise the vacuum interrupter withstands the pulse voltage; $I_{bc}$ ranges from 10-20 mA;

$$I_{b(n)} \geq I_{bc} \quad (2)$$

if the vacuum interrupter breaks down, decreasing an applied pulse voltage in a next conditioning process by $\Delta U$:

$$U_{c(n+1)} = U_{c(n)} - \Delta U \quad (3)$$

wherein a voltage step $\Delta U$ is $P_2$ times of the breakdown voltage $U_L$ under the standard lightning impulse voltage of the vacuum interrupter at the voltage level, and $P_2$ ranges from 1%-4%;

$$\Delta U = P_2 \cdot U_L \quad (4)$$

if the vacuum interrupter withstands the pulse voltage, increasing the applied pulse voltage in the next conditioning process by $\Delta U$:

$$U_{c(n+1)} = U_{c(n)} + \Delta U \quad (5)$$

step 4: counting a trend of the breakdown voltage and a maximum breakdown voltage $U_{bmax}$ during the conditioning process, and calculating the conditioning energy $Q_{c(n)}$ according to waveforms of a measured breakdown voltage $U_{b(n)}$ and the breakdown current $I_{b(n)}$:

$$Q_{c(n)} = \int (U_{b(n)} \cdot I_{b(n)}) dt \quad (6)$$

wherein if the breakdown voltage decreases to $P_3$ times of the maximum breakdown voltage $U_{bmax}$, a deconditioning effect is judged to occur, and $P_3$ ranges from 70%-90%;

$$U_c \leq P_3 \cdot U_{cmax} \qquad (7)$$

then increasing the current-limiting resistor or decreasing the parallel capacitor to decrease a next conditioning energy $Q_{c(n+1)}$ to $P_4$ times of $Q_{c(n)}$, wherein $P_4$ ranges from 80%-90%; meanwhile, counting the trend of breakdown voltage and the maximum breakdown voltage $U_{bmax}$ again;

$$Q_{c(n+1)} P_4 \# Q_{c(n)} \qquad (8)$$

step 5: if the deconditioning effect never occurs since beginning of the conditioning process, defining the conditioning energy as being low, and decreasing the current-limiting resistor or increasing the parallel capacitor to increase the next conditioning energy $Q_{c(n+1)}$ to $P_5$ times of $Q_{c(n)}$, wherein $P_5$ ranges from 105%-120%; if the deconditioning effect occurs, stopping increasing the conditioning energy, so as to gradually adjust the conditioning energy to a critical value where the deconditioning effect does not occur; wherein the critical value is a maximum conditioning energy without damaging the electrode surfaces, which is an optimal conditioning energy;

$$Q_{c(n+1)} P_5 \cdot Q_{c(n)} \qquad (9) \text{ and}$$

step 6: if the maximum breakdown voltage $U_{bmax}$ of the vacuum interrupter does not increase in continuous $N_s$ conditioning experiments during which the deconditioning effect does not occur, regarding insulation performance of the vacuum interrupter as optimal and ending the conditioning process, wherein $N_s$ ranges from 300-500.

2. The pulse voltage conditioning method, as recited in claim 1, wherein the automatic conditioning energy adjustment is realized by programming; the measured breakdown voltage and the breakdown current are input, and a control signal for adjusting the current-limiting resistor and the parallel capacitor is output.

3. The pulse voltage conditioning method, as recited in claim 1, wherein a waveform of the applied pulse voltage is a standard lightning impulse voltage.

4. The pulse voltage conditioning method, as recited in claim 1, wherein the current-limiting resistor is a slide rheostat, which smoothly adjusts a resistance value by controlling a position of a slip sheet; or the current-limiting resistor is a multi-level resistance module, which changes the resistance value by controlling switches of different resistances.

5. The pulse voltage conditioning method, as recited in claim 1, wherein the parallel capacitor is a multi-level capacitance module, which changes a capacitance value by controlling switches of different capacitances.

* * * * *